(12) United States Patent
Matsuda et al.

(10) Patent No.: US 6,254,683 B1
(45) Date of Patent: Jul. 3, 2001

(54) SUBSTRATE TEMPERATURE CONTROL METHOD AND DEVICE

(75) Inventors: Izuru Matsuda, Kadoma; Hideo Haraguchi, Toyonaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/315,463

(22) Filed: May 20, 1999

(30) Foreign Application Priority Data

May 20, 1998 (JP) .................................................. 10-137818

(51) Int. Cl.[7] .............................. C23C 16/00; H05H 1/00
(52) U.S. Cl. ..................... 118/500; 118/724; 118/728; 118/725; 156/345
(58) Field of Search ........................... 118/724, 728, 118/725, 500, 505, 69; 156/345; 269/21; 165/80.5, 48.1, 282, 284; 204/298.09

(56) References Cited

U.S. PATENT DOCUMENTS

| | | | |
|---|---|---|---|
| 5,203,958 | * 4/1993 | Arai et al. ............................. | 156/345 |
| 5,458,687 | * 10/1995 | Shichida et al. ...................... | 118/724 |
| 5,673,750 | * 10/1997 | Tsubone et al. ...................... | 118/724 |
| 5,904,776 | * 5/1999 | Donde et al. ......................... | 118/500 |
| 5,981,913 | * 11/1999 | Kadomura et al. ................. | 219/444.1 |
| 6,012,509 | * 1/2000 | Nonaka ................................ | 118/728 |
| 6,033,478 | * 3/2000 | Kholodenko ......................... | 118/500 |

\* cited by examiner

Primary Examiner—Gregory Mills
Assistant Examiner—P. Hassanzadeh
(74) Attorney, Agent, or Firm—Price and Gess

(57) ABSTRACT

In processing the surface of a substrate 2 that is held with its under-surface in contact with a substrate holder 3 in a vacuum chamber 1, the temperature of substrate 2 is controlled by supplying a heat-conductive gas between the substrate 2 and substrate holder 3. Supply and evacuation of the heat-conductive gas are effected rapidly at high flow rate from both supply line 18 and evacuation line 19 using bypass lines 17a, 17b, while pressure regulation is effected with a low flow rate.

7 Claims, 2 Drawing Sheets

SUBSTRATE TEMPERATURE CONTROL METHOD AND DEVICE

BACKGROUND OF THE INVENTION

1. Technical Field of the Invention

The present invention relates to a substrate temperature control method and device in a thin-film forming step in the manufacture of semiconductor elements, liquid crystal display panels or solar cells etc., or plasma processing apparatuses used in micro-processing steps.

2. Description of Related Art

In recent years, in plasma processing apparatuses, in order to achieve higher device functionality and lower processing costs, great efforts are being made to achieve higher precision, higher speeds, increase of area, and lower damage rates. In this connection, it is desired in particular to achieve uniform and precise control of the substrate temperature over its surface in order to obtain uniformity of film quality within the substrate during deposition and to ensure dimensional accuracy in the dry etching which is used in microprocessing. In order to achieve this, mechanical clamps or electrostatic attracting electrodes are employed as means for controlling substrate temperature and plasma processing apparatuses have begun to be used in which cooling is performed by introducing heat-conducting gas between the substrate and substrate holder.

A plasma processing apparatus using a conventional substrate temperature control device is described below. FIG. 2 shows the reaction chamber of a plasma processing apparatus constituting an example of the prior art. In FIG. 2, 101 is a vacuum chamber having means for reactive gas supply 130 and means for vacuum evacuation 131, 102 is an item to be treated or a substrate such as a silicon wafer, and 103 is an electrostatic attraction-type substrate holder comprising an alumina dielectric part 104 of thickness 5 mm and an aluminum base part 105 provided with a cooling water passage (not shown) in its interior. A pair of internal electrodes 106A, 106B for providing electrostatic attraction and consisting of tungsten are embedded 500 $\mu$m within the outer surface of alumina dielectric part 104. A substrate push-up mechanism 120 is provided for substrate feed purposes within substrate holder 103. 121 is a spacer made of ceramics which electrically insulates vacuum chamber 101 and substrate holder 103. Holes for supplying heat-conductive gas are provided on the face of substrate holder 103 that contacts substrate 102. In this example, holes of diameter 1 mm are regularly arranged at five locations.

107 is a high frequency filter, 108 is a positive electrode DC power source, 109 is a negative electrode DC power source, 110 is a capacitor, 111 is a high frequency power source of frequency 13.56 MHz, and 112 is a grounded upper electrode.

113 is means for heat-conductive gas supply that supplies heat-conductive gas such as He to the gap between the upper surface of substrate holder 103 and the under-surface of substrate 102, comprising a valve and flow rate controller. 114 is a vacuum meter for monitoring the pressure of the heat-conductive gas at the under-surface of substrate 102; the pressure of the heat-conductive gas is controlled by an automatic pressure control valve 115 controlled by a signal from this vacuum meter 114. The flow rate of heat-conductive gas is changed in steps by means of a mass flow controller 116 and constructed so as to supply heat-conductive gas in a short time into a reservoir space comprising piping.

The operation of the plasma processing apparatus constructed as above will now be described. First of all, vacuum chamber 101 is evacuated to vacuum and substrate 102 is arranged on substrate holder 103; by applying positive and negative DC voltages of 1.0 kV from respective DC power sources 108 and 109 through high-frequency filters 107 to the pair of internal electrodes 106A and 106B, substrate 102 is electrostatically attracted on to substrate holder 103.

Next, He gas is supplied to the under-surface of substrate 102 by means for heat-conductive gas supply 113 and is regulated in pressure by automatic pressure control valve 115 and vacuum meter 114 for pressure monitoring at the under-surface of substrate 102. Vacuum meter 114 is set to a pressure such as to maintain attraction of substrate 102 on to substrate holder 103; in this case the pressure is controlled to 2000 Pa. When He gas is supplied by mass flow controller 116, cut-off valves 140, 141 are opened in order to raise the pressure in the gap between substrate holder 103 and substrate 102 to a set value. He gas flows from the holes in the surface of the substrate holder 103 contacting substrate 102 through He gas supply line 118.

Next, vacuum meter 114 for pressure monitoring at the under-surface of substrate 102 controls the pressure of the heat-conductive gas to a set value by regulating the pressure by opening and closing automatic pressure control valve 115. In the initial condition where the pressure is low, mass flow controller 116 permits a flow of He gas of 50 sccm; when the pressure rises to the set value of 2000 Pa, the flow rate of He gas drops to 30 sccm.

After this, the reaction gases $CF_4$ at 30 sccm and $O_2$ at 5 sccm are simultaneously introduced from means for reactive gas supply 130 and regulated to a pressure of 30 Pa by means for vacuum evacuation 131. A plasma is generated by branching the high-frequency power from high-frequency power source 111 into two, these being supplied to the pair of internal electrodes 106A and 106B through capacitors 110 that cut off the DC voltage. The required dry etching is thus performed whilst efficiently cooling substrate 102 from the under-surface using He gas.

When plasma processing has been completed, mass flow controller 116 is stopped, cut-off valve 140 is closed, the heat-conductive gas is evacuated through an evacuation line 119, and the pressure is lowered by fully opening automatic pressure control valve 115 until the pressure of the gap between substrate holder 103 and substrate 102 reaches the pressure in the initial condition. Substrate 102 is then lifted off from substrate holder 103 by means for pushing-up 120.

However, there are the following problems with the above prior art construction. As mentioned above, in order to supply heat-conductive gas in a short time into the reservoir space containing the piping, heat-conductive gas is delivered by mass flow controller 116 at 50 sccm in the initial low-pressure condition, and the pressure is regulated by dropping to 30 sccm when the pressure rises to 2000 Pa. This upper limiting value of the flow rate i.e. 50 sccm is determined by considering a flow rate such that attraction between substrate holder 103 and substrate 102 is not released and a flow rate such that dust is not entrained into the gap between substrate holder 103 and substrate 102 by the gas flow.

Since the upper limiting value of the supply flow rate of the heat-conductive gas was thus restricted, there was the problem that a long time was required before the pressure of the gap between the substrate holder 103 and substrate 102 could be raised to the set value.

A further problem was that the evacuation time after completion of plasma processing was also long, owing to the large evacuation resistance of automatic pressure control valve 115 when the pressure was lowered by fully opening automatic pressure control valve 115.

The conventional plasma processing apparatus therefore suffered from the problems of generation of dust at the under-surface of the substrate, or lowering of through-put.

It should be noted that means for heat-conductive gas supply/evacuation in respect of the gap between the substrate holder 103 and substrate 102 has been proposed in which the time required for supply of heat-conductive gas can be shortened, or it can be made possible to control the pressure to different values in different regions, by providing two or more substrate temperature control devices comprising a valve and flow rate controller. However, there is the problem of high costs and it is necessary to effect adjustment when performing gas pressure regulation, since the conductances of the supply lines cannot be made exactly identical. Also, if different regions are controlled to different pressures, there are problems such as that uniform etching cannot be achieved due to pressure differences if a substrate holder, whereby pressure can be raised to for example 3000 Pa, is employed.

Furthermore, means have been proposed wherein the supply line and evacuation line are constituted as a supply/evacuation direct line without connecting to the gap between the upper surface of substrate holder 103 and the under-surface of substrate 102, respectively, the line being branched after pressure regulation of the heat-conductive gas and connected to the gap between the substrate holder 103 and substrate 102, thereby reducing costs by simplification of the lines of the piping, but there is the problem that, even if some abnormality occurs in the gap between the surface of the substrate holder 103 and substrate 102, such as for example blockage of the holes for heat-conductive gas supply which are provided in the upper surface of substrate holder 103 by a foreign body of the substrate under-surface, mechanical abnormality cannot be detected.

SUMMARY OF THE INVENTION

In view of the problems of the prior art described above, it is an object of the present invention to provide a method and device for substrate temperature control whereby device through-put can be raised and high reliability ensured by making it possible to perform supply/evacuation of heat-conductive gas rapidly without entraining dust from the substrate under-surface, by a straightforward low-cost construction.

A method of substrate temperature control according to the present invention in which, in processing in a vacuum chamber a surface of a substrate that is held with its under-surface in contact with a substrate holder, the substrate temperature is controlled by supplying a heat-conductive gas between the substrate and substrate holder, includes procedures of: supplying the heat-conductive gas between the substrate and substrate holder and evacuating the heat-conductive gas with a high flow rate using both of a supply line and an evacuation line; and adjusting and maintaining pressure with a low flow rate, thereby enabling supply/evacuation of heat-conductive gas to be performed rapidly and high device through-put to be achieved.

Preferably, when evacuating the heat-conductive gas, the pressure in the vacuum chamber is made higher than or equivalent to the pressure between the substrate and substrate holder, by which entrainment of dust from the gap between the substrate holder and substrate etc. into the vacuum chamber by the gas current can be prevented.

Also according to the present invention, the device for controlling substrate temperature by supplying a heat-conductive gas between a substrate and a substrate holder in accordance with a processing performed to a surface of the substrate whose under-surface is held in contact with the substrate holder in a vacuum chamber having an evacuation device, comprises: a system for supplying the heat-conductive gas which performs supply, holding, and evacuation of the heat-conductive gas rapidly in respect of a gap between the substrate and substrate holder; thus, since supply and evacuation of heat-conductive gas can be performed rapidly, high device through-put can be achieved.

By controlling the system for supplying the heat-conductive gas so as to maintain the substrate below a prescribed temperature, precise plasma processing can be performed.

By providing the system for supplying the heat-conductive gas with at least one supply line and one evacuation line respectively, these supply line and evacuation line being mutually connected by a bypass line provided with a valve, whereby the heat-conductive gas can be supplied from both of the supply line and evacuation line by opening the valve, supply of heat-conductive gas can be performed in a rapid manner. Furthermore, by closing the valve after supply, if blockage of the hole for heat-conductive gas supply has occurred, the abnormality can be detected mechanically, enabling treatment to be performed in a reliable manner.

Also, by providing the system for supplying the heat-conductive gas with at least one supply line and one evacuation line respectively, which evacuation line is constituted by arranging in parallel a line having an automatic pressure control valve and a line having a cut-off valve, whereby the heat-conductive gas can be evacuated from both of the supply line and evacuation line by opening the cut-off valve, even if the evacuation resistance of the automatic pressure control valve is large, evacuation of heat-conductive gas can be performed rapidly.

By providing a construction such that the heat-conductive gas is supplied until the pressure between the substrate and substrate holder is equivalent to or greater than a pressure value that has a substrate cooling effect, subsequent pressure maintenance when the gas flow rate has dropped can be performed in a rapid and stable manner.

Also, by providing the system for supplying the heat-conductive gas with at least one supply line and one evacuation line respectively, these supply line and evacuation line being mutually connected by a bypass line on which a valve is provided, and when the heat-conductive gas is evacuated, the valve is opened and evacuation is performed from both of the supply line and evacuation line until the pressure of the heat-conductive gas between the substrate and substrate holder drops to a value such as not to act with a force to move the substrate, in a condition in which the electrostatic force has been eliminated, the substrate can be pushed up and lifted off the substrate holder without mis-positioning.

Also, by providing in the face of the substrate holder contacting the substrate a heat-conductive gas supply hole whereby the conductance of the heat-conductive gas current is made small, in particular a heat-conductive gas supply hole in which is inserted a ceramic element of porosity 50% to 70%, entrainment of dust from the gap between the substrate holder and substrate by the gas current can be prevented even if the flow rate of heat-conductive gas is large, thanks to the resistance to which the flow of heat-conductive gas is subjected.

The method and device for substrate temperature control described above can be favorably applied to a plasma processing method and apparatus.

DESCRIPTION OF PREFERRED EMBODIMENTS

An embodiment wherein a substrate temperature control device according to the present invention is applied to a reactive ion etching-type dry etching apparatus is described below with reference to FIG. 1.

Figure 1:
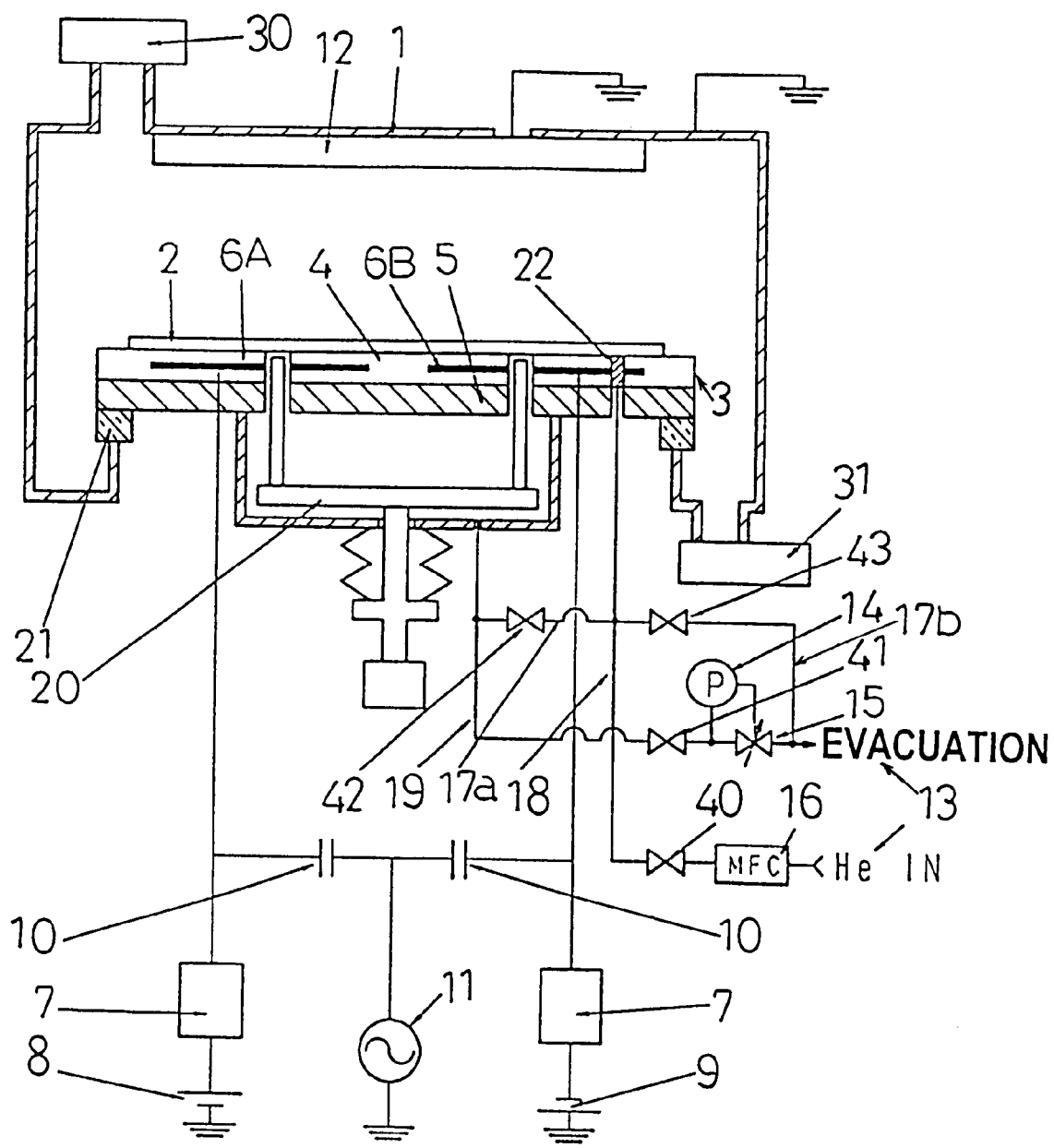
FIG. 1 is a cross-sectional view of a reaction chamber in an embodiment of a plasma processing apparatus in which a substrate temperature control device according to the present invention is applied.
Figure 2:
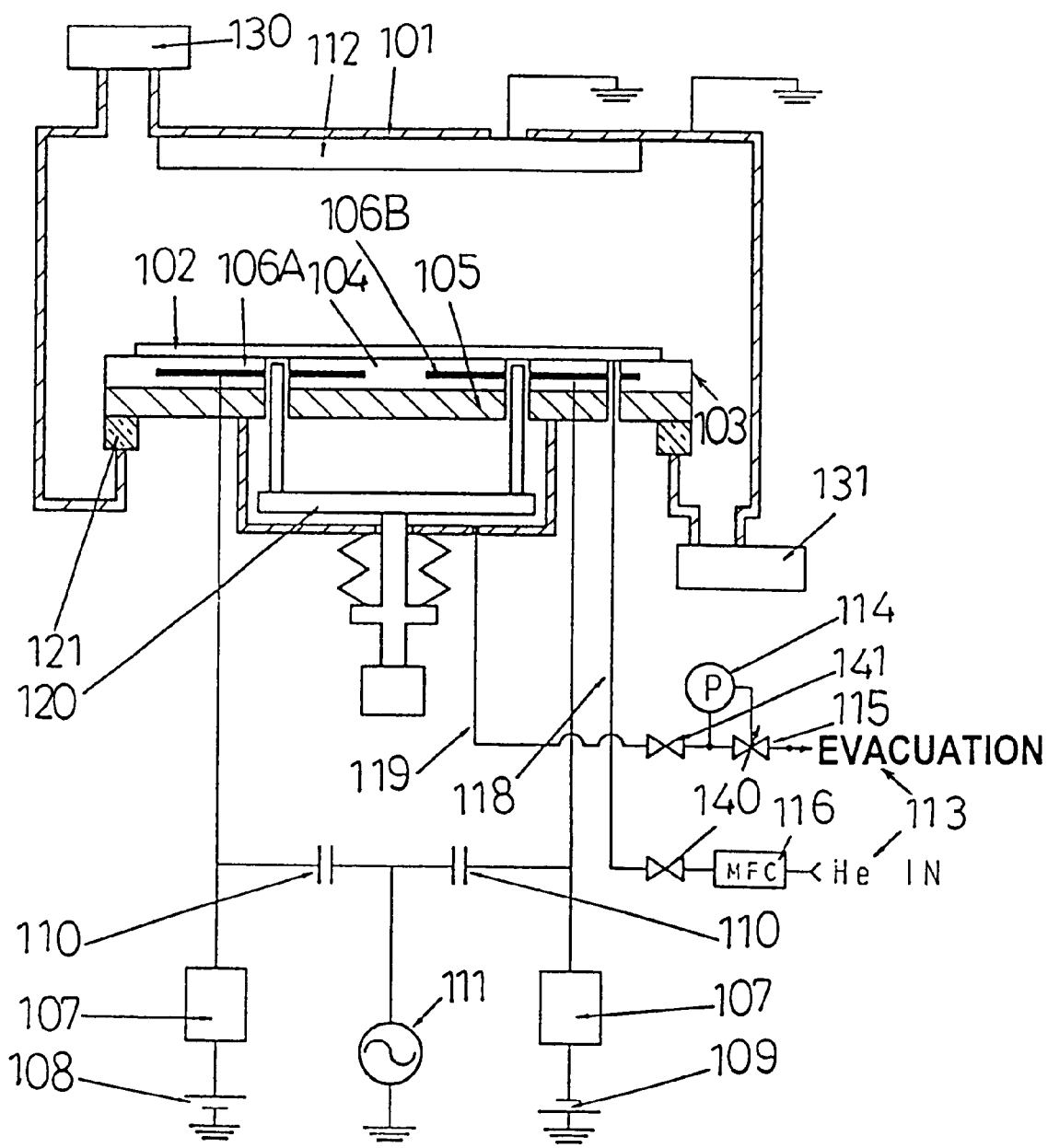
FIG. 2 is a cross-sectional view of the reaction chamber of a prior art plasma processing apparatus.

In FIG. 1, 1 is a vacuum chamber having means for reactive gas supply 30 and means for vacuum evacuation 31, 2 is a substrate such as a silicon wafer constituting the item under treatment, and 3 is an electrostatic attraction-type substrate holder, comprising an alumina dielectric part 4 of thickness 5 mm and an aluminum base part 5 provided with a cooling water passage (not shown). A pair of electrostatic attraction internal electrodes 6A, 6B made of tungsten are embedded 500 $\mu$m within the outer surface of alumina dielectric part 4. Substrate push-up mechanism 20 for substrate feed purposes is provided in the interior of substrate holder 3. 21 is a spacer made of ceramics, which electrically insulates vacuum chamber 1 and substrate holder 3. A hole for supplying heat-conductive gas is provided in the face of substrate holder 3 that contacts substrate 2; in order to reduce the conductance of the heat-conductive gas flow, a ceramic element 22 of porosity 50% to 70% is inserted in the hole. 7 is a high frequency filter, 8 is a positive electrode DC power source, 9 is a negative electrode DC power source, 10 are capacitors, 11 is a 13.56 MHz high frequency power source, and 12 is a grounded upper electrode.

13 represents a system for heat-conductive gas supply that supplies heat-conductive gas such as He to the gap between the upper surface of substrate holder 3 and the undersurface of substrate 2, and comprises valves and a flow rate controller. 14 is a vacuum meter for monitoring the pressure of heat-conductive gas at the under-surface of substrate 2; the pressure is regulated by controlling an automatic pressure control valve 15 by means of a signal of this vacuum meter 14. The construction is such that heat-conductive gas is supplied in a short time to a reservoir space comprising piping by step-wise alteration of the conductive gas flow rate by mass flow controller 16. In order for supply and evacuation of heat-conductive gas to be performed by the same system for heat-conductive gas supply 13, the upstream side and downstream side of automatic pressure control valve 15 of this supply line 18 and evacuation line 19 are connected by respective bypass lines 17a, 17b. Respective cut-off valves 40, 41, 42 and 43 are provided on supply line 18, evacuation line 19 and bypass lines 17a, 17b.

The operation of a dry etching apparatus constructed as above is described below. First of all, the interior of vacuum chamber 1 is evacuated to vacuum, a substrate 2 is placed on substrate holder 3, and positive and negative DC voltages of 1.0 kV are respectively applied through high frequency filters 7 to the pair of internal electrodes 6A, 6B, thereby electrostatically attracting substrate 2 on to substrate holder 3.

Next, He gas, with its flow rate controlled by mass flow controller 16, is supplied to the under-surface of substrate 2 by the system for heat-conductive gas supply 13, the pressure at the under-surface of substrate 2 being adjusted by vacuum meter 14 for pressure monitoring and automatic pressure control valve 15. The pressure is set by vacuum meter 14 such that the attraction of substrate 2 on to substrate holder 3 is not released; in this case, the pressure is controlled to 2000 Pa. First of all, cut-off valves 40, 41, 42 are opened in order to shorten the time required for elevation of the pressure of the gap between substrate holder 3 and substrate 2 to the set value when the He gas is supplied. Since valves 40, 41 and 42 are now open, He gas can be supplied rapidly from both supply line 18 and evacuation line 19 through bypass line 17a. Since the ceramic element 22 of porosity 60% is inserted into the hole of substrate holder 3 on the side contacting substrate 2 in order to reduce the conductance of the He gas flow, even if a large current of He gas is delivered by mass flow controller 16, the resistance provided by ceramic element 22 prevents He gas from flowing directly into the gap between substrate holder 3 and substrate 2, so there is no possibility of dust from the gap between substrate holder 3 and substrate 2 being entrained by the gas flow.

Next, when a certain degree of pressure rise is detected by pressure monitoring vacuum meter 14 at the under-surface of substrate 2, cut-off valve 42 is closed, and pressure is regulated by opening and closing of automatic pressure control valve 15. In this embodiment, mass flow controller 16 delivers heat-conductive gas at 100 sccm (first flow rate Q1) in the initial low-pressure condition, resulting in a pressure overshoot to a value of 2200 Pa, which is 10% higher than the set value of 2000 Pa; subsequently pressure control is performed to the set pressure, with the flow rate reduced to 30 sccm (second flow rate Q2). Q1 should preferably be three to ten times as large as Q2, so as to shorten the time required for supply of the heat-conductive gas with a high flow rate not to the extent that the substrate placed on the substrate holder is displaced.

After this, the reactive gases $CF_4$ at 30 sccm and $O_2$ at 5 sccm are simultaneously introduced from means for reactive gas supply 30 and the pressure is regulated to 30 Pa by means for vacuum evacuation 31. The pair of internal electrodes 6A, 6B are supplied, through capacitors 10 which cut off DC voltage with high frequency power branched into two from high frequency power source 11. Plasma is thereby generated and the desired dry etching is performed whilst cooling substrate 2 efficiently with He gas from its underside.

After completion of the above plasma processing, the flow rate of mass flow controller 16 is adjusted to 0, and the pressure is lowered by fully opening automatic pressure control valve 15 until the pressure of the gap between substrate holder 3 and substrate 2 is the initial-condition pressure, by closing cut-off valve 40 and opening cut-off valve 41. In this embodiment, further, in order to overcome the problem of the evacuation time being protracted owing to the large evacuation resistance of automatic pressure control valve 15, evacuation is effected by bypassing automatic pressure control valve 15 from both supply line 18 and evacuation line 19 through bypass lines 17a, 17b by opening cut-off valves 42 and 43, and, in addition, evacuation is effected from evacuation line 19 in which automatic pressure control valve 15 is arranged. Thus, evacuation is effected to a value such that, in a condition where the electrostatic force has disappeared, the pressure of the heat-conductive gas in the gap of the substrate 2 and substrate holder 3 has a value such that no force acts to move substrate 2 i.e. for example the pressure of 100 Pa. Also, when evacuating the heat-conductive gas from supply line 18 and evacuation line 19 and both bypass lines 17a, 17b, entrainment of dust from the gap between substrate holder 3 and substrate 2 and/or substrate push-up mechanism 20 or the He gas supply hole by the gas current can be prevented by adjusting the pressure within vacuum chamber 1 to a condition higher than or equivalent to the pressure between substrate 2 and substrate holder 3, for example 100 Pa, by introducing a gas that is inexpensive and has no effect on plasma processing, such as for example $N_2$, at 100 sccm, from the gas introduction port. Substrate 2 is then lifted off from substrate holder 3 by substrate push-up mechanism 20.

With the embodiment described above, by connecting the heat-conductive gas supply line 18 and evacuation line 19 by bypass lines 17a, 17b, the time required for supply and evacuation of the heat-conductive gas until the pressure of the gap between the substrate holder 3 and substrate 2 reaches a set value is shortened, and furthermore the mechanism is simple, so device throughput can be improved without increased costs.

Also, since cut-off valve 42 is closed when vacuum meter 14 for pressure monitoring at the under-surface of substrate 2 detects that pressure has reached a set value, and pressure is adjusted by opening and closing automatic pressure control valve 15, if blockage etc. of the hole for supply of heating-conductive gas at the surface of the electrostatic attraction electrode occurs, mechanical abnormality can be detected with the result that reliable processing can be performed. Also, since the conductance of the heat-conductive gas flow in the hole in the surface of substrate holder 3 contacting substrate 2 is optimized, even if mass flow controller 16 delivers a large flow rate, since this is subjected to resistance, the heat-conductive gas cannot flow directly into the gap between substrate holder 3 and substrate 2, so there is no possibility of dust in the gap between the substrate holder 3 and substrate 2 being entrained by the gas flow.

Also, entrainment of dust from the gap between the substrate holder 3 and substrate 2 and/or substrate push-up mechanism 20 or heat-conductive gas supply hole by the current of gas can be prevented, by adjusting the pressure within the vacuum chamber 1 on evacuation to a condition higher than or equivalent to the pressure between substrate 2 and substrate holder 3.

Furthermore, it should be noted that, although in the embodiment described above, a single supply line and a single evacuation line of heat-conductive gas were used, two or more lines may be provided. Also, although He gas was used as the heat-conductive gas flowing at the under-surface of substrate 2, inert gases other than this or other gases could be employed.

In the above embodiment, a ceramic element 22 of porosity 50% to 70% was inserted in the hole whereby heat-conductive gas is supplied that is formed in the face of substrate holder 3 contacting substrate 2, in order to reduce the conductance of the current of heat conducted gas. However, the material properties are not restricted to this so long as the material is electrically insulating.

Also, although, in the above embodiment, substrate holder 3 was provided with so-called double-electrode type electrostatic attraction electrodes comprising a pair of internal electrodes 6A, 6B, the same benefits could be obtained by employing a single-electrode type electrostatic attraction electrode. Also, although an electrostatic attraction-type substrate holder 3 was employed in the above embodiment, the same benefits could be obtained by employing a substrate holder whose surface is covered with insulator and which is either grounded or has high frequency power applied thereto, in the case of a substrate made of insulating material, in particular in the case where processing is performed based on attraction and deposition.

In the above embodiment, a dry etching apparatus of the reactive ion etching type was illustrated by way of example, but the method of generating a plasma is not restricted to this and plasma generating methods such as inductively coupled type, ECR type, helicon type or surface-wave type methods may be applied.

Also, not only in the dry etching apparatus taken as example in the above embodiment, but the benefit of the invention is also obtained by applying it to a plasma CVD apparatus, sputtering apparatus or ashing apparatus.

While preferred embodiments of the present invention have been described using specific terms, such description is for illustrative purposes only, and it is to be understood that changes and variations may be made without departing from the spirit or scope of the following claims.

What is claimed is:

1. A device for substrate temperature control in an apparatus for processing a substrate within a vacuum chamber, comprising:

a source of heat-transfer gas;

a substrate holder on which a substrate to be processed is placed, said substrate holder being provided with at least one opening, through which the heat-transfer gas is supplied to a gap between an underside of the substrate holder;

a supply line for supplying the heat-transfer gas to the gap between the underside of the substrate and the substrate holder;

an evacuating line equipped with a pressure control valve system for releasing the heat-transfer gas;

a bypass line equipped with a pressure control valve system for bypass the pressure control valve system of the evacuation line; and a valve system operably connected to the bypass line to enable a charging and a discharging of the heat-conductive gas through both of the supply line and the evacuation line.

2. The device for substrate temperature control according to according to claim 1, wherein the opening formed in the substrate holder is made of a material having a property to limit the flow of the heat-conductive gas supplied therethrough.

3. The device for substrate temperature control according to claim 2, wherein the material for the substrate opening is ceramic.

4. The device for substrate temperature control according to claim 3 wherein the ceramic material has a porosity of about 70%.

5. The device for substrate temperature control according to claim 1 wherein the heat conductive gas is supplied initially at a first flow rate $Q_1$ using both the supply line and the evacuation line and subsequently adjusted and mainained at a second flow rate $Q_2$ wherein $Q_2 \leq Q_1$.

6. The device for substrate temperature control according to claim 1 further including a gas supply gas to the vacuum chamber and mean for supplying gas at a pressure in the vacuum chamber higher than or equivalent to the pressure between the substrate and the substrate holder during evacuating the heat conductive gas after the depositing of material on the substrate.

7. The device for substrate temperature control according to claim 1 further including means for controlling, when the substrate is loaded in, the flow of the heat-conductive gas from both the supply line and evacuation line until the pressure reaches a predetermined value, and supply and evacuation are performed respectively by the supply line and the evacuation line during the processing, and when the processing has been completed, evacuation is performed from both of the supply line and evacuation line.

\* \* \* \* \*